United States Patent
Kim et al.

(10) Patent No.: US 10,306,779 B2
(45) Date of Patent: May 28, 2019

(54) SEMICONDUCTOR SUPPORT FRAME AND STORAGE DEVICE HAVING THE SAME

(71) Applicant: Samsung Electronics Co., Ltd., Suwon-si, Gyeonggi-do (KR)

(72) Inventors: Yu-Sung Kim, Seoul (KR); Ji-Yong Kim, Suwon-si (KR); Chung-Hyun Ryu, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 211 days.

(21) Appl. No.: 15/285,261

(22) Filed: Oct. 4, 2016

(65) Prior Publication Data
US 2017/0105290 A1    Apr. 13, 2017

(30) Foreign Application Priority Data

Oct. 8, 2015    (KR) .................. 10-2015-0141458

(51) Int. Cl.
*H05K 5/00*       (2006.01)
*H05K 1/14*       (2006.01)
*G11C 5/04*       (2006.01)

(52) U.S. Cl.
CPC ............. *H05K 5/0008* (2013.01); *G11C 5/04* (2013.01); *H05K 1/148* (2013.01); *H05K 5/0026* (2013.01); *H05K 2201/056* (2013.01); *H05K 2201/10424* (2013.01)

(58) Field of Classification Search
CPC .... H05K 5/0008; H05K 5/0026; H05K 1/148; H05K 2201/056; H05K 2201/10424; H05K 1/144; G11C 5/05
See application file for complete search history.

(56) References Cited

U.S. PATENT DOCUMENTS

| | | | | |
|---|---|---|---|---|
| 5,070,258 A | * | 12/1991 | Izumi | ................. B60R 16/0239 326/101 |
| 5,159,751 A | * | 11/1992 | Cottingham | ........... H05K 1/028 29/832 |
| 5,777,381 A | * | 7/1998 | Nishida | ................... H01L 23/32 257/685 |

(Continued)

FOREIGN PATENT DOCUMENTS

| JP | 2006-184377 | 7/2006 |
|---|---|---|
| JP | 2006-184383 | 7/2006 |

(Continued)

*Primary Examiner* — Hoa C Nguyen
*Assistant Examiner* — Christopher L Augustin
(74) *Attorney, Agent, or Firm* — Myers Bigel, P.A.

(57) ABSTRACT

A substrate support frame includes a body having an upper surface for supporting a first module substrate and a lower surface for supporting a second module substrate, and including a plurality of extending portions that define a cavity for receiving semiconductor devices mounted on first and second module substrates, a curved portion protruding outwardly from a first one of the extending portions of the body corresponding to a position of a flexible substrate that electrically connects the first and second module substrates to each other, the curved portion having a curved sectional shape protruding toward the flexible substrate, and a fastening hole penetrating through the first one of the extending portions of the body and configured to receive a screw to couple the body to at least one of the first and second module substrates.

20 Claims, 6 Drawing Sheets

(56) References Cited

U.S. PATENT DOCUMENTS

| | | | |
|---|---|---|---|
| 6,721,189 B1* | 4/2004 | Haba | H05K 1/147 174/254 |
| 6,862,053 B2 | 3/2005 | Lee et al. | |
| 7,206,037 B2 | 4/2007 | Nishio et al. | |
| 10,085,345 B2* | 9/2018 | Tuominen | H01L 23/5387 |
| 2004/0020687 A1* | 2/2004 | Moore | H05K 1/0212 174/254 |
| 2005/0174748 A1* | 8/2005 | Kojima | H05K 1/189 361/796 |
| 2008/0130234 A1* | 6/2008 | Maehara | G06F 1/203 361/704 |
| 2008/0164901 A1* | 7/2008 | Kim | G01R 1/04 324/750.27 |
| 2011/0139492 A1* | 6/2011 | Sugane | H05K 1/0218 174/254 |
| 2014/0198464 A1 | 7/2014 | Yi et al. | |
| 2014/0241062 A1* | 8/2014 | Jeseritz | G11C 5/04 365/185.17 |
| 2014/0362326 A1 | 12/2014 | Terazawa et al. | |
| 2014/0376174 A1* | 12/2014 | Dean | G06F 1/186 361/679.46 |
| 2015/0124397 A1* | 5/2015 | Dean | H05K 7/20145 361/679.46 |
| 2017/0212556 A1* | 7/2017 | Jovanovic | G06F 1/1652 |

FOREIGN PATENT DOCUMENTS

| | | |
|---|---|---|
| JP | 2008-184377 | 7/2006 |
| JP | 2007-323017 | 12/2007 |
| JP | 2014-224939 | 12/2014 |
| KR | 1020080067846 | 7/2008 |
| KR | 10-0940334 | 6/2009 |

* cited by examiner

SEMICONDUCTOR SUPPORT FRAME AND STORAGE DEVICE HAVING THE SAME

RELATED APPLICATIONS

This application claims priority under 35 U.S.C. § 119 to Korean Patent Application No. 10-2015-0141458, filed on Oct. 8, 2015, the contents of which are incorporated by reference herein in their entirety.

BACKGROUND

Example embodiments of the inventive concept relate to a substrate support frame and a storage device having the same. More particularly, example embodiments of the inventive concept relate to a substrate support frame interposed between module substrates electrically connected to each other by a flexible substrate and a storage device having the same.

As electronic devices, e.g., storage devices, have been highly integrated and miniaturized, the storage device may include module substrates stacked on each other, with each of the module substrates having semiconductor packages thereon.

A flexible substrate, e.g., Flexible Printed Circuit Board (FPCB), may be used for the module substrate. The flexible substrate can be bent easily to facilitate miniaturization, but the flexible substrate may be vulnerable to and damaged by an external impact.

SUMMARY

Example embodiments of the inventive concept provide a substrate support frame capable of preventing damage to a flexible substrate.

Example embodiments of the inventive concept provide a storage device including the substrate support frame.

According to some example embodiments, a substrate support frame includes a body having an upper surface for supporting a first module substrate and a lower surface for supporting a second module substrate, and including a plurality of extending portions that define a cavity for receiving semiconductor devices mounted on first and second module substrates when the first module substrate is supported on the upper surface of the body and the second module substrate is supported on the lower surface of the body, a curved portion protruding outwardly from a first extending portion of the plurality of extending portions of the body corresponding to a position of a flexible substrate that electrically connects the first and second module substrates when the first module substrate is supported on the upper surface of the body and the second module substrate is supported on the lower surface of the body, the curved portion having a curved sectional shape protruding toward the flexible substrate, and a fastening hole penetrating through the first extending portion of the body and configured to receive a screw to couple the body and at least one of the first and second module substrates when the first module substrate is supported on the upper surface of the body and the second module substrate is supported on the lower surface of the body.

In example embodiments, the plurality of extending portions may extend along peripheral regions of the first and second module substrates to form a closed loop.

In example embodiments, the curved portion may have a radius of curvature substantially the same as that of the flexible substrate.

In example embodiments, the curved portion may have a semicircular sectional shape.

In example embodiments, the curved portion may extend along the first extending portion to have a length the same as or greater than a length of the flexible substrate.

In example embodiments, the substrate support frame may further include a fixing member protruding from the upper surface or the lower surface of the body to contact a first side portion of the first module substrate or a first side portion of the second module substrate.

In example embodiments, the substrate support frame may further include a support member protruding from the upper surface or the lower surface of the body to contact a second side portion of the first module substrate or a second side portion of the second module substrate.

In example embodiments, the substrate support frame may further include a positioning alignment hole penetrating through at least one of the plurality of extending portions of the body and configured to receive a positioning alignment pin.

In example embodiments, the body, the first and second module substrates and a case configured to surround at least a portion of the body, the first module substrate and the second module substrate may be aligned by the positioning alignment pin that is received in the positioning alignment hole.

According to some other example embodiments, a storage device include first and second module substrates configured to be coupled to a case by one or more fasteners, each of the first and second module substrates having semiconductor packages mounted thereon, a flexible substrate electrically connecting the first and second module substrates to each other, and a substrate support frame interposed between the first and second module substrates. The substrate support frame includes a body having an upper surface supporting the first module substrate and a lower surface supporting the second module substrate and including a plurality of extending portions defining a cavity receiving the semiconductor devices mounted on first and second module substrates, a curved portion protruding outwardly from a first extending portion of the plurality of extending portions of the body that is adjacent the flexible substrate, the curved portion having a curved sectional shape protruding toward the flexible substrate, and one or more fastening holes penetrating through the first extending portion of the body and into which the one or more fasteners are inserted to couple the body and at least one of the first and second module substrates.

In example embodiments, the curved portion may have a radius of curvature substantially the same as that of the flexible substrate.

In example embodiments, the curved portion may have a semicircular sectional shape.

In example embodiments, the storage device may further include a fixing member protruding from the upper surface or the lower surface of the body and contacting a first side portion of the first module substrate or a first side portion of the second module substrate.

In example embodiments, the storage device may further include a support member protruding from the upper surface or the lower surface of the body and contacting a second side portion of the first module substrate or a second side portion of the second module substrate.

In example embodiments, the storage device may further include a positioning alignment hole penetrating through at least one of the plurality of extending portions of the body and receiving a positioning alignment pin of the case.

In some other example embodiments, a substrate support frame includes a body comprising a plurality of outer interconnected segments defining an inner cavity. The body has an upper surface configured to support a first module substrate such that one or more semiconductor devices mounted on the first module substrate are received in the inner cavity and a lower surface configured to support a second module substrate such that one or more semiconductor devices mounted on the second module substrate are received in the inner cavity. A curved portion extends outwardly away from the inner cavity from a first outer segment of the plurality of the outer segments that is adjacent a flexible substrate that electrically connects the first and second module substrates and is curved when the first module substrate is supported on the upper surface of the body and the second module substrate is supported on the lower surface of the body. The curved portion and curved flexible substrate have substantially the same radius of curvature.

In example embodiments, the curved portion and the curved flexible substrate may be spaced apart from one another.

In example embodiments, a first hook shaped fixing member may extend from the upper surface of the body at a second outer segment of the plurality of the elongated segments that is opposite the first outer segment. The first fixing member may be configured to engage a side portion of the first module substrate and an upper surface of the first module substrate. A second hook shaped fixing member may extend from the lower surface of the body at the second outer segment. The second fixing member may be configured to engage a side portion of the second module substrate and a lower surface of the second module substrate.

In example embodiments, a first supporting member may extend from the upper surface of the body at the first outer segment and may be configured to engage a lower surface of the first module substrate. A second supporting member may extend from the lower surface of the body at the first outer segment and may be configured to engage an upper surface of the second module substrate.

In example embodiments, first and second fastening holes of the base may be on opposite sides of the curved portion. The first and second fastening holes may be positioned and configured to align with first and second fastening holes of the first module substrate when the first module substrate is supported on the upper surface of the body. The first and second fastening holes may be positioned and configured to align with first and second fastening holes of the second module substrate when the second module substrate is supported on the lower surface of the body.

According to example embodiments of the inventive concept, a substrate support frame may include a curved portion extending or protruding toward a flexible substrate to prevent the flexible substrate from bending in a reverse direction of a bent direction of the flexible substrate due to an external impact. Further, the substrate support frame may include fastener (e.g., screw-threaded) holes positioned adjacent to the flexible substrate to prevent a warpage of the flexible substrate.

BRIEF DESCRIPTION OF THE DRAWINGS

Example embodiments of the inventive concept will be more clearly understood from the following detailed description taken in conjunction with the accompanying drawings.

FIG. 1 is an exploded perspective view illustrating a storage device in accordance with example embodiments.

FIG. 2 is a perspective view illustrating a substrate support frame of FIG. 1.

FIG. 3 is an exploded perspective view illustrating a module substrate assembly of FIG. 1.

FIG. 4 is a perspective view illustrating the module substrate assembly of FIG. 3.

FIG. 5 is a cross-sectional view taken along the line A-A' in FIG. 4.

FIG. 6 is a cross-sectional view taken along the line B-B' in FIG. 4.

FIG. 7 is a cross-sectional view taken along the line C-C' in FIG. 4.

DETAILED DESCRIPTION OF EXAMPLE EMBODIMENTS

Figure 1:
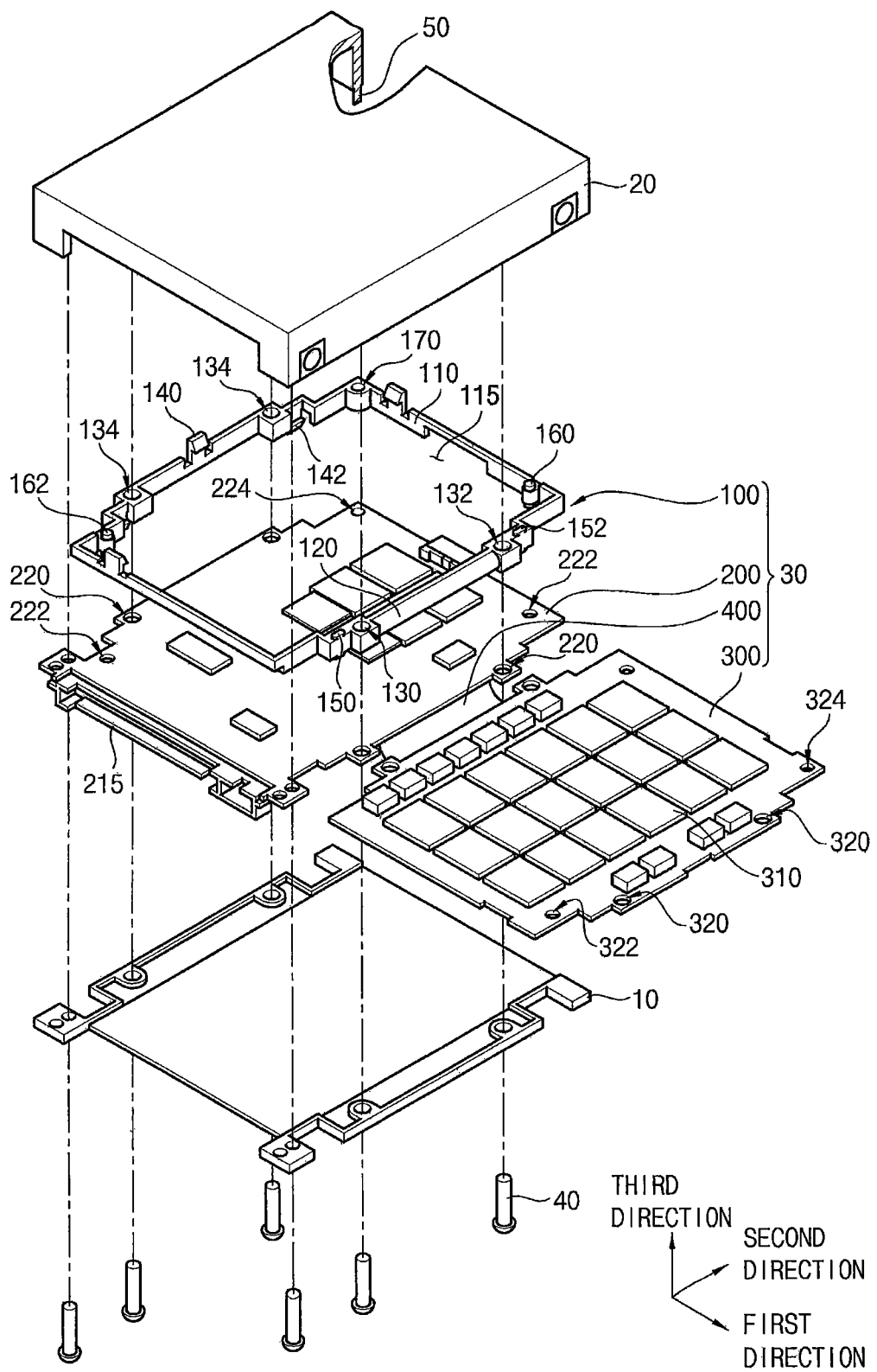
FIGS. 1 to 7 represent non-limiting, example embodiments as described herein.

Various example embodiments of the inventive concept will be described more fully hereinafter with reference to the accompanying drawings, in which example embodiments are shown. The inventive concept may, however, be embodied in many different forms and should not be construed as limited to example embodiments set forth herein. Rather, these example embodiments are provided so that this disclosure will be thorough and complete, and will fully convey the scope of the inventive concept to those skilled in the art. In the drawings, the sizes and relative sizes of components or elements may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element or layer is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
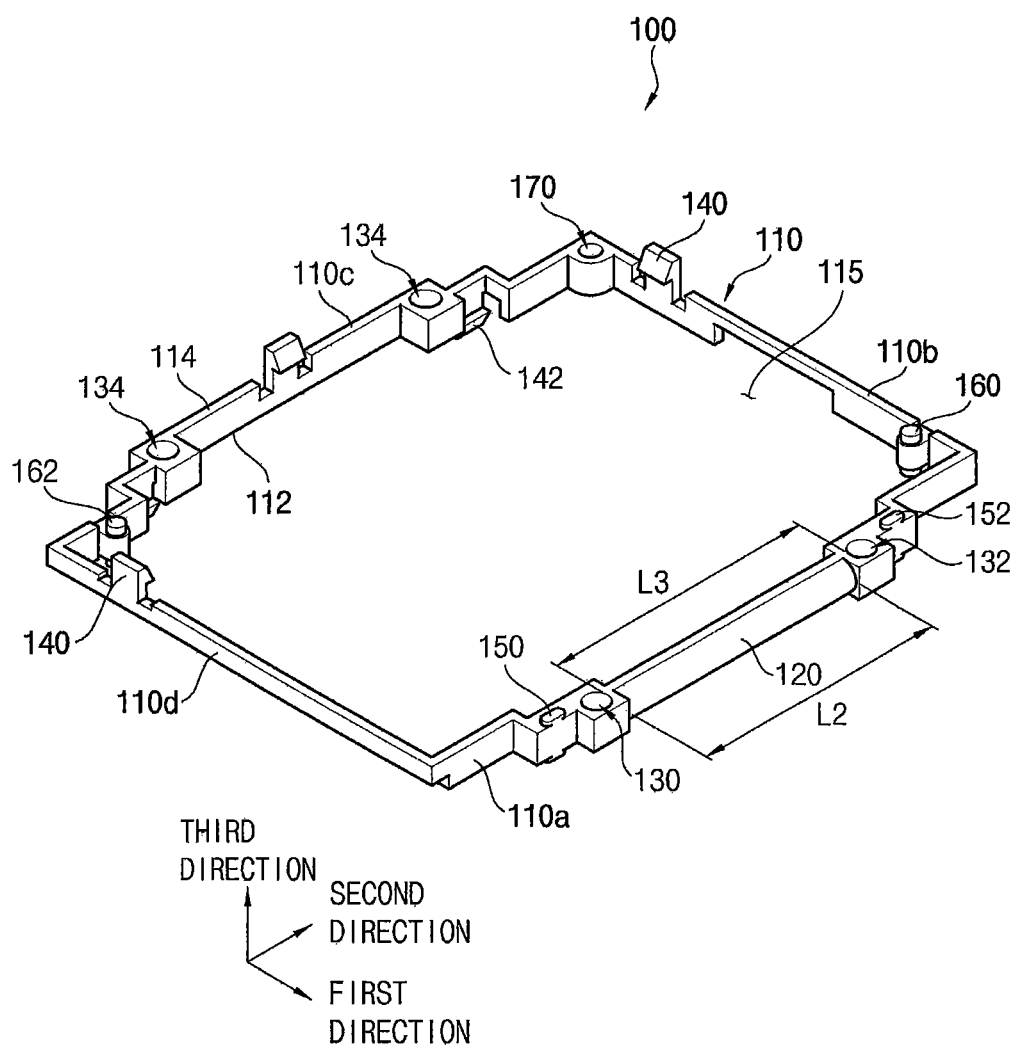
Figure 3:
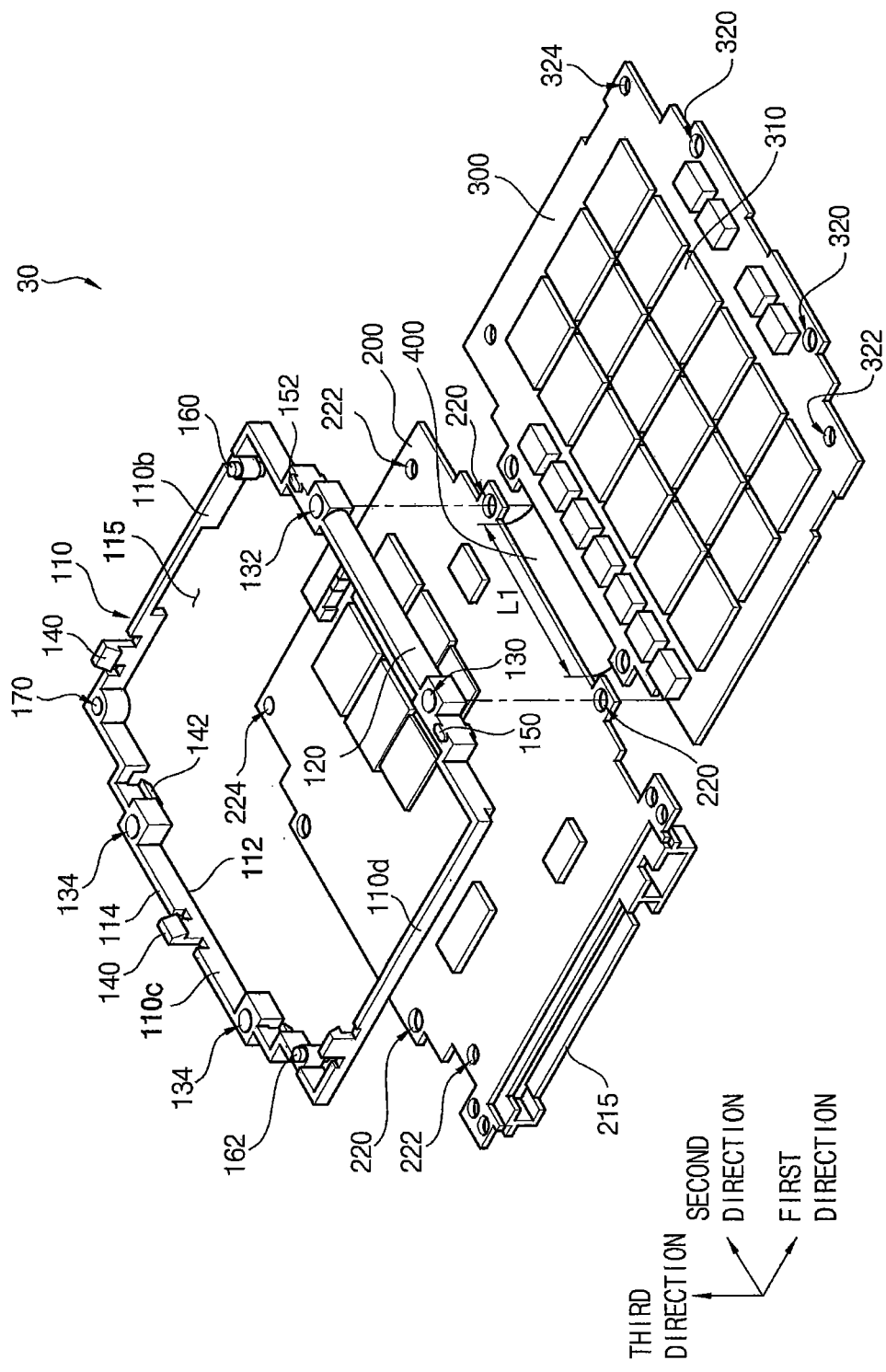
Figure 4:
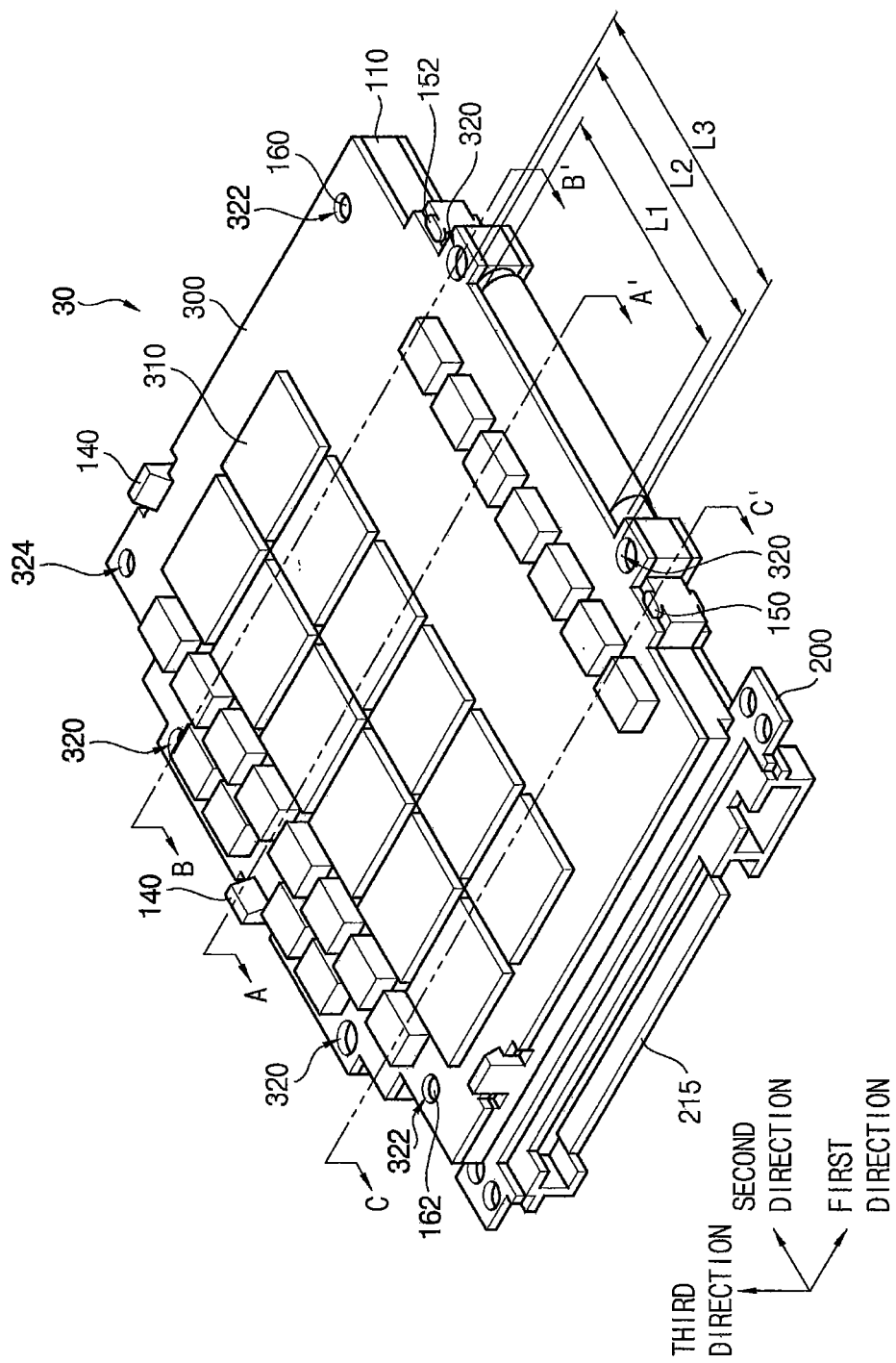
Figure 5:
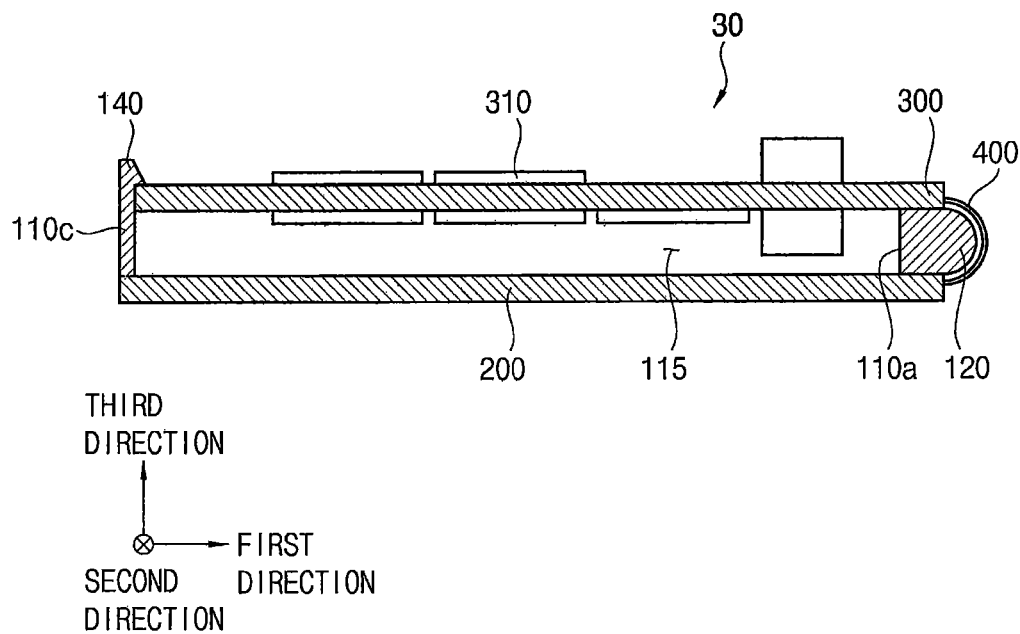
Figure 6:
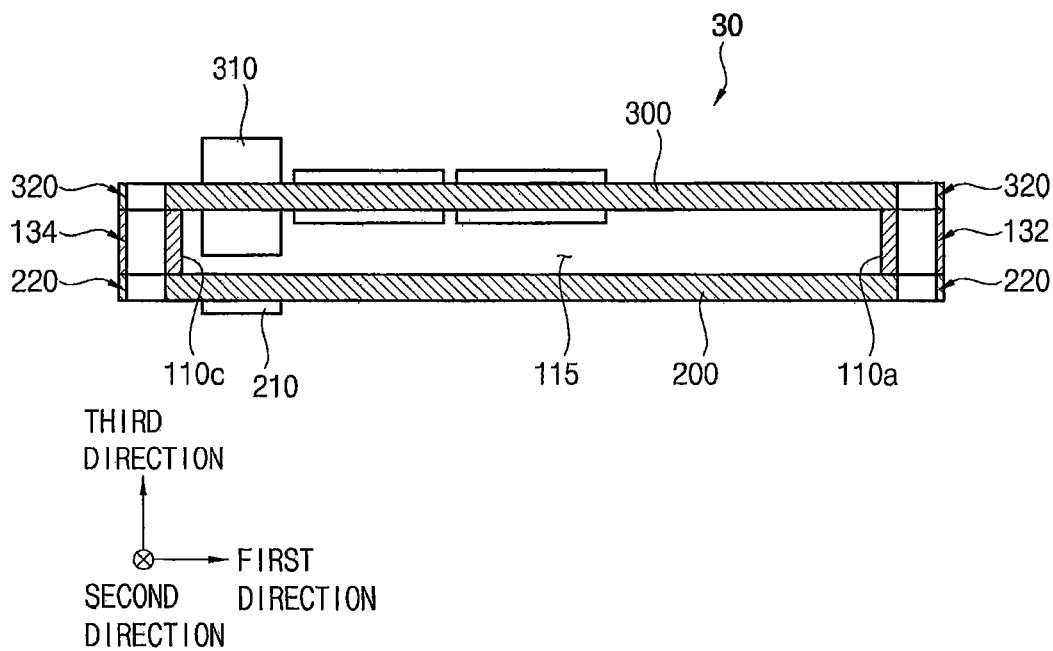
Figure 7:
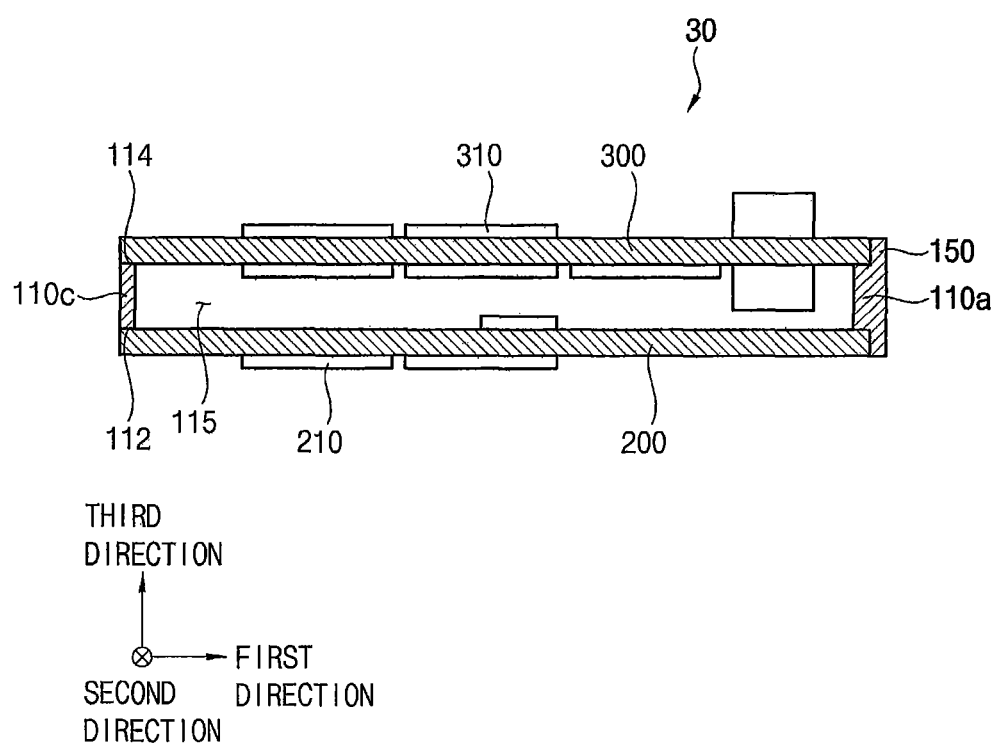

FIG. 1 is an exploded perspective view illustrating a storage device in accordance with example embodiments. FIG. 2 is a perspective view illustrating a substrate support frame of FIG. 1. FIG. 3 is an exploded perspective view illustrating a module substrate assembly of FIG. 1. FIG. 4 is a perspective view illustrating the module substrate assembly of FIG. 3. FIG. 5 is a cross-sectional view taken along the line A-A' in FIG. 4. FIG. 6 is a cross-sectional view taken along the line B-B' in FIG. 4. FIG. 7 is a cross-sectional view taken along the line C-C' in FIG. 4.

Referring to FIGS. 1 to 7, a storage device may include a module substrate assembly 30 having module substrates 200 and 300 sequentially stacked on each other and a substrate support frame 100, a case receiving the module substrate assembly 30, one or more fasteners such as one or more screws 40 fastening the module substrate assembly 30 to the case, and a positioning alignment pin 50 for aligning the module substrate 30 assembly with the case when the screw is assembled or installed.

The storage device may be an electronic device capable of reading and writing data. For example, the storage device may be or include solid state drive (SSD), hard disk, etc. The storage device may be used alone or used in various devices, e.g., PC, notebook, smart phone, tablet PC, digital camera, MP3 player, PDA, etc.

The case may receive the module substrate assembly 30 therein to protect the module substrate assembly 30 from the surrounding environment. For example, the case may be or include metal, plastic, etc.

In example embodiments, the case may include a base 10 and a cover 20. The cover 20 may cover an upper surface of the base 10 to protect the module substrate assembly 30. The base 10 and the module substrate assembly 30 may be fixed to the cover 20 by the screws 40 penetrating therethrough. In some embodiments, the case may include at least three parts.

The module substrate assembly 30 may include a first module substrate 200, a second module substrate 300, a substrate support frame 100 and a flexible substrate 400. The first module substrate 200, the substrate support frame 100 and the second module substrate 300 may be sequentially stacked on the base 10. The flexible substrate 400 may electrically connect an end or side portion of the first module substrate 200 and an end or side portion of the second module substrate 300. Although the module substrate assembly 30 is illustrated in FIG. 1 as having a pair of the module substrates 200 and 300 opposite to each other and one substrate support frame 100 interposed therebetween, it may not be limited thereto. For example, the module substrate assembly 30 may include at least three module substrates sequentially stacked on one another and at least two substrate support frames respectively interposed between the module substrates.

The first module substrate 200 and the second module substrate 300 may have a rectangular and/or square shape. A plurality of first semiconductor packages 210 may be mounted on the first module substrate 200, and a plurality of second semiconductor packages 310 may be mounted on the second module substrate 300. A connector 215 having connection terminals for interconnection with a host system may be provided at an end portion of the first module substrate 200.

In example embodiments, the first and second module substrates 200 and 300 may include a single-layered or multi-layered circuit substrate. For example, the first and second module substrates 200 and 300 may be a printed circuit board (PCB). The PCB may include wirings and vias connected to the wirings. The wirings may include printed circuit patterns for interconnecting with the first semiconductor packages 210 or the second semiconductor packages 310.

The first semiconductor packages 210 and the second semiconductor packages 310 may include a logic chip, a memory chip, etc. The memory chip may include a non-volatile memory device or a volatile memory device. Examples of the volatile memory device may be DRAM (Dynamic Random Access Memory) device, SRAM (Static Random Access Memory) device, etc. Examples of the non-volatile memory devices may be NAND flash device, PRAM (Phase Change Random Access Memory) device, MRAM (Magnetic Random Access Memory) device, RRAM (Resistive Random Access Memory) device, etc. The logic chip may include logic devices for controlling the memory devices.

In example embodiments, a plurality of through holes may be formed in the first and second module substrates 200 and 300, respectively. For example, a plurality of first fastening holes 220 for the fasteners or screws 40, at least one first positioning alignment hole 222 for alignment with the substrate support frame 100 and at least one second positioning alignment hole 224 for alignment with the case may be formed in the first module substrate 200. A plurality of second fastening holes 320 for the fasteners or screws 40, at least one third positioning alignment hole 322 for alignment with the substrate support frame 100 and at least one fourth positioning alignment hole 324 for alignment with the case may be formed in the second module substrate 300. The first and second fastening holes 220 and 320 may be screw-threaded to be combined with the screws 40 (e.g., the first and second fastening holes 220 and 320 may be threaded to threadingly engage with the screws 40). The positions and the number of the holes 220, 222, 224, 320, 322 and 324 may be determined in consideration of sizes and thicknesses of the module substrates.

In example embodiments, the flexible substrate 400 may include circuits and wirings therein, and may be a single-layered or multi-layered flexible circuit board. For example, the flexible substrate 400 may be a flexible PCB (FPCB). The FPCB may include Polyethersulphone (PES), Polyacrylate (PAR), Polyetherimide (PEI), Polyethyelenen Napthalate (PEN), Polyethyelene Terepthalate (PET), Polyphenylene Sulfide (PPS), Polyallylate, Polyimide, Polycarbonate (PC), Cellulose Triacetate (TAC), Cellulose Acetate Propionate (CAP), etc.

The flexible substrate 400 may extend from a first side portion of the first module substrate 200 to a first side portion of the second module substrate 300 to electrically connect the first module substrate 200 and the second module substrate 300 to each other. The flexible substrate 400 may be bent (e.g., curved) to connect the first module substrate 200 and the second module substrate 300. For example, the flexible substrate 400 may extend in a first direction from the first side portion of the first module substrate 200, bend to have a curve having a predetermined radius of curvature, and then extend in a reverse direction of the first direction to be connected to the first side portion of the second module substrate 300. Thus, the first module substrate 200 and the second module substrate 300 may be spaced apart from each other in a third direction perpendicular (e.g., vertical) to the first direction. The substrate support frame 100 may be interposed between the spaced apart first and second module substrates 200 and 300.

The flexible substrate 400 may extend to have a first length L1 in a second direction. The second direction may be perpendicular or substantially perpendicular to the first direction and the third direction.

The substrate support frame 100 may be interposed between the first module substrate 200 and the second module substrate 300 to prevent the second module substrate 300 from contacting the first module substrate 200 and to provide a space for receiving the first semiconductor packages 210 and the second semiconductor packages 310.

In example embodiments, the substrate support frame 100 may include a body 110, a curved portion 120 having an arcuate surface extending or protruding toward the flexible substrate 400, a fastening portion or feature for combining the body 110 with the first module substrate 200, the second module substrate 300 and the case, and a positioning alignment portion or feature for aligning the body 110 with the first and second module substrates 200 and 300.

The body 110 may be interposed between the first module substrate 200 and the second module substrate 300. Thus, the first module substrate 200, the body 110 and the second module substrate 300 may be sequentially stacked on one another.

As illustrated in FIGS. 2 and 3, the body 110 may have a lower surface 112 for supporting an upper surface of the first module substrate 200 and an upper surface 114 for supporting a lower surface of the second module substrate 300. A distance between the lower surface 112 and the upper surface 114 may be defined as a thickness of the body 110.

In example embodiments, the body 110 may include a plurality of extending portions or elongated segments extending in the first direction or the second direction along peripheral portions or regions of the first module substrate 200 and the second module substrate 300. For example, the body 110 may include first and third extending portions or segments 110a and 110c that extend in the second direction and second and fourth extending portions or segments 110b and 110d that extend in the first direction. For example, the extending portions may be an extending rod, a support bar, a rail, etc. Upper surfaces of the first to fourth extending portions 110a, 110b, 110c and 110d may form or define the upper surface 114 of the body 110, and lower surfaces of the first to fourth extending portions 110a, 110b, 110c and 110d may form or define the lower surface 112 of the body 110. In some embodiments, the first to fourth extending portions 110a, 110b, 110c and 110d may form a closed loop. Alternatively, the first to fourth extending portions 110a, 110b, 110c and 110d may have or define a cutout, gap or opening in the closed loop shape.

In example embodiments, the body 110 may be or include metal or plastic.

The curved portion 120 may be provided in a portion of the first extending portion 11a corresponding to a position of the flexible substrate 400. The curved portion 120 may extend or protrude in the first direction toward the flexible substrate 400, and also extend in the second direction. The protruding curved portion may be positioned to be spaced apart from the flexible substrate 400. The curved portion 120 may protrude in the first direction from the first extending portion 110a to thereby decrease a gap between the body 110 and the flexible substrate 400. Thus, although impact is exerted on the bent flexible substrate 400 from the surrounding environment, the curved portion 120 may contact and support the flexible substrate 400 to prevent the flexible substrate 400 from bending in a reverse direction of the first direction.

In example embodiments, the curved portion 120 may have a radius of curvature the same or substantially the same as that of the flexible substrate 400. For example, when the bending flexible substrate 400 has an arc shape, the curved portion 120 may have a semicircular sectional shape. Alternatively, the curved portion 120 may have a semielliptical sectional shape or a polygonal sectional shape corresponding to the bending shape of the flexible substrate 400.

In example embodiments, the curved portion 120 may extend to have a second length L2 in the second direction. The second length L2 may be the same as or greater than the first length L1 of the flexible substrate 400.

The fastening portion may include fastening holes into which the fasteners or screws 40 are inserted, and fixing members for fixing the first and second module substrates 200 and 300 to the body 110.

A plurality of the fastening holes may be formed to penetrate through the body 110 in the third direction. For example, the fastening portion may include third and fourth fastening holes 130 and 132 respectively penetrating the first extending portion 110a and positioned adjacent both (opposite) sides of the curved portion 120. As illustrated in FIG. 6, when the module substrate assembly 30 is assembled, the third and fourth fastening holes 130 and 132 may be aligned with the first fastening holes 220 of the first module substrate 200 and the second fastening holes 320 of the second module substrate 300, respectively. The screws 40 may be received in (e.g., screwed into) the aligned third and fourth fastening holes 130 and 132, and thus the module substrate assembly 30 may be fixed to the case.

In example embodiments, the third and fourth fastening holes 130 and 132 may be positioned adjacent the flexible substrate 400. That is, a distance between the third fastening hole 130 and the fourth fastening hole 132 may be a third length L3, and the third length L3 may be the same as or greater than the first length L1 of the flexible substrate 400. The third and fourth fastening holes 130 and 132 may be positioned adjacent opposite sides of the flexible substrate 400 and the screws 40 may be combined or coupled with the case through the third and fourth fastening holes 130 and 132, so that a warpage or misalignment of the flexible substrate 400 due to an external impact may be prevented.

In some example embodiments, the fastening portion may further include one or more fifth fastening holes 134 formed in at least one of the second, third and fourth extending portions 11b, 110c and 110d. As illustrated in FIG. 6, when the module substrate assembly 30 is assembled, the fifth fastening holes 134 may be aligned with the first fastening holes 220 of the first module substrate 200 and the second fastening holes 320 of the second module substrate 300, respectively. The screws 40 may be received in (e.g., screwed into) the aligned fastening holes 220, 320 and 134, and thus the module substrate assembly 30 may be fixed to the case. Accordingly, the module substrate assembly 30 may be combined or coupled more securely with the case.

The fastening portion may include a first fixing member 140 extending or protruding in the third direction from the upper surface 114 of the body 110 to contact a second side portion of the second module substrate 300 opposite to the first side portion, and a second fixing member 142 extending or protruding in a reverse direction of the third direction from the lower surface 112 of the body 110 to contact a second side portion of the first module substrate 200 opposite to the first side portion. The first and second fixing members 140 and 142 may contact the second side portions of the second and first module substrates 300 and 200, respectively, to fix the first and second module substrates 200 and 300 to the substrate support frame 100.

In this case, the substrate support frame 100 may include a plurality of the first and second fixing members 140 and 142 in desired positions of the body 110.

As illustrated in FIG. 5, the first and second fixing members 140 and 142 may have, for example, a hook shape. The first fixing member 140 having the hook shape may surround and apply pressure to the second side portion and a portion of the upper surface of the second module substrate 300 to fix the second module substrate 300 to the substrate support frame 100. The second fixing member 142 having the hook shape may surround and apply pressure to the second side portion and a portion of the lower surface of the first module substrate 200 to fix the first module substrate 200 to the substrate support frame 100. However, the shapes of the first and second fixing members 140 and 142 may not be limited thereto, and the first and second fixing members may have various shapes adapted for fixing the first and second module substrates 200 and 300 to the substrate support frame 100.

The positioning alignment portion may include supporting members 150, 152 and position aligning members 160, 162 for aligning the substrate support frame 100 and the first and second module substrates 200 and 300 with each other, and a fifth positioning alignment hole 170 for aligning the module substrate assembly 30 and the case with each other when the module substrate assembly 30 is combined or coupled with the case by the screws 40.

When the fixing members 140 and 142 are combined or coupled with the module substrates 200 and 300, the fixing members 140 and 142 may apply pressure to the module substrates 200 and 300 in the first direction, so that the substrate support frame 100 and the module substrates 200 and 300 may not be aligned with each other. The supporting members 150 and 152 may be formed at positions of the extending portion opposite the fixing members 140 and 142 and extend or protrude therefrom to contact the first side portions of the first and second module substrates 200 and 300, to thereby maintain alignment therebetween. For example, when the fixing member is formed in the third extending portion 110c, the supporting member may be formed in the first extending portion 110a.

For example, the supporting member may include a first support member 150 extending or protruding from the upper surface 114 of the body 110 in the third direction to contact the first side portion of the second module substrate 300, and a second support member 152 extending or protruding from the lower surface 112 of the body 110 in the reverse direction of the third direction to contact the first side portion of the first module substrate 200. A plurality of the first and second support members 150 and 152 may be provided in desired positions.

The positioning alignment members 160, 162 may extend or protrude from the upper surface 114 and/or the lower surface 112 of the body 110. At least a portion of the positioning alignment members 160, 162 extending or protruding from the body 110 may be received in the first positioning alignment hole 222 of the first module substrate 200 and/or the third positioning alignment hole 322 of the second module substrate 300. That is, when assembling the module substrate assembly 30, the positioning alignment members 160, 162 may be inserted into or received in the corresponding first and third positioning alignment holes 222 and 322 and therefore alignment between the substrate support frame 100 and the module substrates 200 and 300 may be maintained. A plurality of the positioning alignment members may be provided in desired positions.

The fifth positioning alignment hole 170 may be formed to penetrate through at least one of the first to fourth extending portions 110a, 110b, 110c and 110d of the body 110. The second positioning alignment hole 224 of the first module substrate 200 and the fourth positioning alignment hole 324 of the second module substrate 300 may be positioned to be aligned. As illustrated in FIG. 1, when the module substrate assembly 30 and the case are assembled with each other, the positioning alignment pin 50 may be inserted into or received in the second, fourth and fifth positioning alignment holes 224, 324 and 170 to align the module substrate assembly 30 with the case. Accordingly, a process time required for final assembly of the storage device may be reduced.

The foregoing is illustrative of the inventive concept and is not to be construed as limiting thereof. Although a few example embodiments have been described, those skilled in the art will readily appreciate that many modifications are possible in the example embodiments without materially departing from the novel teachings and advantages of the inventive concept. Accordingly, all such modifications are intended to be included within the scope of the inventive concept as defined in the claims.

What is claimed is:
1. A substrate support frame comprising:
a body having an upper surface for supporting a first module substrate and a lower surface for supporting a second module substrate, and including first, second, third, and fourth extending portions that define a cavity for receiving semiconductor devices mounted on first and second module substrates when the first module substrate is supported on the upper surface of the body and the second module substrate is supported on the lower surface of the body;
an elongated curved portion at a central portion of the first extending portion of the body protruding outwardly from the first extending portion of the body corresponding to a position of a flexible substrate that electrically connects the first and second module substrates when the first module substrate is supported on the upper surface of the body and the second module substrate is supported on the lower surface of the body to thereby decrease a gap between the first extending portion of the body and the flexible substrate, the curved portion having a curved sectional shape protruding toward the flexible substrate; and first and second fastening holes penetrating through the first extending portion of the body on opposite sides of the curved portion and configured to receive first and second fasteners to couple the body and at least one of the first and second module substrates when the first module substrate is supported on the upper surface of the body and the second module substrate is supported on the lower surface of the body.

2. The substrate support frame of claim 1, wherein the first, second, third, and fourth extending portions extend along peripheral regions of the first and second module substrates to form a closed loop.

3. The substrate support frame of claim 1, wherein the curved portion has a radius of curvature substantially the same as that of the flexible substrate.

4. The substrate support frame of claim 1, wherein the curved portion has a semicircular sectional shape.

5. The substrate support frame of claim 1, wherein the curved portion extends along the first extending portion of the body to have a length the same as or greater than a length of the flexible substrate.

6. The substrate support frame of claim 1, further comprising a first fixing member protruding from the upper surface of the body to contact a first side portion of the first module substrate and an upper surface of the first module substrate and a second fixing member protruding from the lower surface of the body to contact a first side portion of the second module substrate and a lower surface of the second module substrate.

7. The substrate support frame of claim 1, further comprising a support member protruding from the upper surface or the lower surface of the body to contact a lower surface of the first module substrate at a second side portion of the first module substrate or an upper surface of the second module substrate at a second side portion of the second module substrate.

8. The substrate support frame of claim 1, further comprising a positioning alignment hole penetrating through at least one of the first, second, third, and fourth extending portions of the body and configured to receive a positioning alignment pin.

9. The substrate support frame of claim 8, wherein the body, the first and second module substrates and a case configured to surround at least a portion of the body, the first module substrate and the second module substrate are aligned by the positioning alignment pin that is received in the positioning alignment hole.

10. The substrate support frame of claim 1, wherein the first extending portion of the body comprises first and second side portions on opposite sides of the central portion, and wherein the central portion protrudes outwardly from each of the first and second side portions a distance corresponding to the gap.

11. A storage device comprising:
first and second module substrates configured to be coupled to a case by at least first and second fasteners, each of the first and second module substrates having semiconductor devices mounted thereon;
a flexible substrate electrically connecting the first and second module substrates to each other; and
a substrate support frame interposed between the first and second module substrates,
the substrate support frame comprising:
a body having an upper surface supporting the first module substrate and a lower surface supporting the second module substrate and including first second, third, and fourth extending portions defining a cavity receiving the semiconductor devices mounted on first and second module substrates;
an elongated curved portion at a central portion of the first extending portion of the body protruding outwardly from the first extending portion of the body to thereby reduce a gap between the first extending portion of the body and the flexible substrate and such that the curved portion is adjacent the flexible substrate, the curved portion having a curved sectional shape protruding toward the flexible substrate; and
first and second fastening holes penetrating through the first extending portion of the body on opposite sides of the curved portion and into which the first and second fasteners are inserted to couple the body and at least one of the first and second module substrates.

12. The storage device of claim 11, wherein the curved portion has a radius of curvature substantially the same as that of the flexible substrate.

13. The storage device of claim 11, wherein the curved portion has a semicircular sectional shape.

14. The storage device of claim 11, further comprising a first fixing member protruding from the upper surface of the body and contacting a first side portion of the first module substrate and an upper surface of the first module substrate and a second fixing member protruding from the lower surface of the body and contacting a first side portion of the second module substrate and a lower surface of the second module substrate.

15. The storage device of claim 11, further comprising a support member protruding from the upper surface or the lower surface of the body and contacting a lower surface of the first module substrate at a second side portion of the first module substrate or an upper surface of the second module substrate at a second side portion of the second module substrate.

16. The storage device of claim 11, further comprising a positioning alignment hole penetrating through at least one of the plurality of first, second, third, and fourth extending portions of the body and receiving a positioning alignment pin of the case.

17. A substrate support frame comprising:
a body comprising a plurality of outer interconnected segments defining an inner cavity, the body having an upper surface configured to support a first module substrate such that one or more semiconductor devices mounted on the first module substrate are received in the inner cavity and a lower surface configured to support a second module substrate such that one or more semiconductor devices mounted on the second module substrate are received in the inner cavity;
a curved portion extending outwardly away from the inner cavity from a first outer segment of the plurality of the outer interconnected segments that is adjacent a flexible substrate that electrically connects the first and second module substrates and is curved when the first module substrate is supported on the upper surface of the body and the second module substrate is supported on the lower surface of the body;
a first hook shaped fixing member extending from the upper surface of the body at a second outer segment of the plurality of the outer interconnected segments that is opposite the first outer segment, the first fixing member configured to engage a side portion of the first module substrate and an upper surface of the first module substrate; and a second hook shaped fixing member extending from the lower surface of the body at the second outer segment, the second fixing member configured to engage a side portion of the second module substrate and a lower surface of the second module substrate, wherein the curved portion and the curved flexible substrate have substantially the same radius of curvature.

18. The substrate support frame of claim 17, wherein the curved portion and the curved flexible substrate are spaced apart from one another.

19. The substrate support frame of claim 17, further comprising:
 a first supporting member extending from the upper surface of the body at the first outer segment and configured to engage a lower surface of the first module substrate; and
 a second supporting member extending from the lower surface of the body at the first outer segment and configured to engage an upper surface of the second module substrate.

20. The substrate support frame of claim 17, further comprising first and second fastening holes of the body on opposite sides of the curved portion, the first and second fastening holes positioned and configured to align with first and second fastening holes of the first module substrate when the first module substrate is supported on the upper surface of the body, the first and second fastening holes also positioned and configured to align with first and second fastening holes of the second module substrate when the second module substrate is supported on the lower surface of the body.

* * * * *